United States Patent
Bi et al.

(10) Patent No.: US 9,647,120 B1
(45) Date of Patent: May 9, 2017

(54) VERTICAL FET SYMMETRIC AND ASYMMETRIC SOURCE/DRAIN FORMATION

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/297,377

(22) Filed: Oct. 19, 2016

(51) Int. Cl.
*H01L 29/78* (2006.01)
*H01L 29/66* (2006.01)
*H01L 29/417* (2006.01)
*H01L 23/535* (2006.01)
*H01L 29/06* (2006.01)
*H01L 21/324* (2006.01)
*H01L 21/306* (2006.01)

(52) U.S. Cl.
CPC ...... *H01L 29/785* (2013.01); *H01L 21/30604* (2013.01); *H01L 21/324* (2013.01); *H01L 23/535* (2013.01); *H01L 29/0657* (2013.01); *H01L 29/41791* (2013.01); *H01L 29/66553* (2013.01); *H01L 29/66795* (2013.01)

(58) Field of Classification Search
CPC combination set(s) only.
See application file for complete search history.

(56) References Cited

U.S. PATENT DOCUMENTS

| | | | |
|---|---|---|---|
| 7,372,091 B2 | 5/2008 | Leslie | |
| 8,946,029 B2 | 2/2015 | Wong et al. | |
| 8,963,274 B2 | 2/2015 | Dixon | |
| 9,153,496 B2 | 10/2015 | Wong et al. | |
| 9,337,340 B2 | 5/2016 | Chi et al. | |
| 9,362,285 B2 | 6/2016 | Basker et al. | |
| 9,362,383 B1 | 6/2016 | Balakrishnan et al. | |
| 9,368,512 B1 | 6/2016 | Cheng et al. | |
| 9,379,217 B2 | 6/2016 | Ho et al. | |
| 9,385,197 B2 | 7/2016 | Kelly et al. | |
| 2013/0134485 A1* | 5/2013 | Fumitake | H01L 29/808 257/287 |
| 2013/0248942 A1* | 9/2013 | Okano | H01L 29/045 257/255 |
| 2015/0194430 A1* | 7/2015 | Karda | H01L 27/1052 257/331 |
| 2016/0064483 A1 | 3/2016 | Kelly et al. | |
| 2016/0093741 A1 | 3/2016 | Yang et al. | |

(Continued)

*Primary Examiner* — Mamadou Diallo
(74) *Attorney, Agent, or Firm* — Cantor Colburn LLP; Vazken Alexanian (57) ABSTRACT

A method for forming features of a vertical FET device, starting with a semiconductor substrate that includes fins and a horizontal surface. The fins also have a base, a top, and sidewalls. An etch process is performed to create bottom lateral recesses at the base of the fins. The method continues with growing a bottom source/drain region in the bottom recesses which forms PN junctions, and etching the fins to form top lateral recesses at the top of the fins. The method continues with growing a top source/drain region in the top recesses of the fins, therefore forming PN junctions.

20 Claims, 4 Drawing Sheets

(56) References Cited

U.S. PATENT DOCUMENTS

| | | |
|---|---|---|
| 2016/0099246 A1 | 4/2016 | Basker et al. |
| 2016/0126326 A1 | 5/2016 | Park et al. |
| 2016/0172357 A1 | 6/2016 | Song |
| 2016/0190303 A1 | 6/2016 | Liu et al. |

\* cited by examiner

FIG. 14

VERTICAL FET SYMMETRIC AND ASYMMETRIC SOURCE/DRAIN FORMATION

BACKGROUND

The present invention generally relates to complementary metal-oxide-semiconductor (CMOS) fabrication methods and related structures. More specifically, the present invention relates to methods and device architectures for fabricating vertical field-effect transistor (VFET) devices with symmetric and asymmetric source/drain regions.

In contemporary CMOS device fabrication processes, the design of top and bottom source/drain regions is a factor in the performance characteristics of a VFET device. Known VFET fabrication methods, including epitaxial grown processes, employ complicated processes requiring several detailed steps and specialized functions in order to fabricate devices using vertical fin structures.

SUMMARY

Embodiments are directed to a method for forming features of a field-effect transistor (FET) device. The method includes forming a semiconductor substrate that has a fin structure (fins), where the substrate has a horizontal surface, and where the fins have a base, a top, and sidewalls. The method continues with etching away the mask on a lower portion of the fin sidewalls and etching the fin sidewalls to form bottom lateral recesses at the base of the fins. The method further includes growing a bottom source/drain (S/D) region in the bottom lateral recesses of the fins, which forms PN junctions with the fins. The method further includes etching the fin sidewalls to form top lateral recesses at the top of the fins, and growing a top S/D regions in the top lateral recesses of the fins, which forms PN junctions with the fins.

Embodiments are also directed to a semiconductor field-effect transistor (FET) device that includes a semiconductor substrate with a fin structure and a bottom lateral recess in the fins. The bottom lateral recess contains a bottom S/D region that forms PN junctions with the fins. The device also includes a bottom spacer, a high-k gate structure, and a top spacer over the bottom S/D region. The device also includes a top lateral recess in the fins containing a top S/D region, which forms PN junctions with the fins. The device further includes a metal contact layer over the fin structure and top S/D region.

BRIEF DESCRIPTION OF THE DRAWINGS

The subject matter of embodiments of the present invention are particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, methods and devices described herein discuss embodiments of forming S/D regions of a VFET device in order to improve channel transport performance. The methods also include extending PN junction depths deeper into the fin structure and the ability to fabricate S/D regions that are unique in shape to create asymmetric S/D regions. The methods described herein employ S/D regions that can be individually fabricated in unique shapes and individually doped. Using this approach, FET transistors can be formed with S/D regions with different operating properties. Additionally, the PN junctions formed between the S/D regions and the fins has a sharper transition and can be pushed deeper into the substrate. Further, VFETs formed according to the method described herein can be tuned to improve performance over known VFET architectures.

Figure 1:
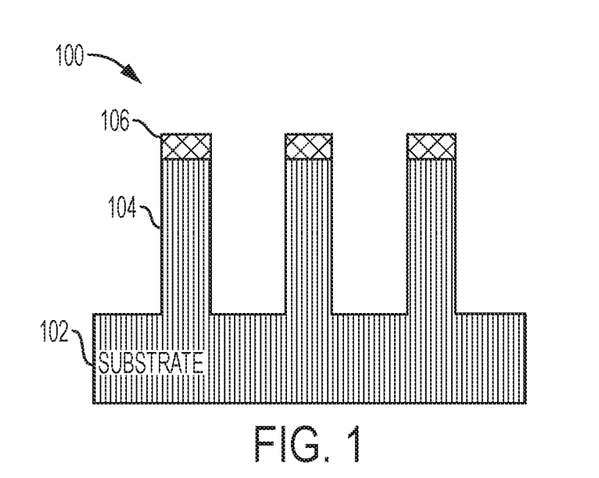
FIG. 1 depicts a cross-sectional view of a semiconductor structure with a hard mask layered on top of the fins according to embodiments of the present invention.

Methods for forming asymmetric and symmetric S/D regions in VFETs using fabrication methodologies and resulting structures according to embodiments of the present invention are described in detail below by referring to the accompanying drawings in FIGS. 1-14. FIG. 1 depicts a cross-sectional view of a semiconductor structure 100 with a hard mask layered on top of fins according to embodiments of the present invention. The structure 100 includes a semiconductor substrate 102, a fin structure 104 (fins), and a hard mask 106 deposited on top of the fins 104. One or more fins 104 can be formed from the same material as the substrate 102. The mask 106 can be formed from silicon nitride (SiN) and is layered over the top portion of the fins 104. The substrate 102 can include silicon, germanium, silicon germanium, silicon carbide, and those consisting essentially of III-V compound semiconductors. Other suitable substrates include II-VI compound semiconductors. The substrate 102 can also include an organic semiconductor or a layered semiconductor such as, for example, Si/SiGe, a silicon-on-insulator or a SiGe-on-insulator. A portion or the entire substrate 102 can be amorphous, polycrystalline, or monocrystalline. The substrate 102 can be doped or undoped, or contain doped regions and undoped regions therein. The substrate 102 can also contain regions with strain and regions without strain therein, or contain regions of tensile strain and compressive strain.

Figure 2:
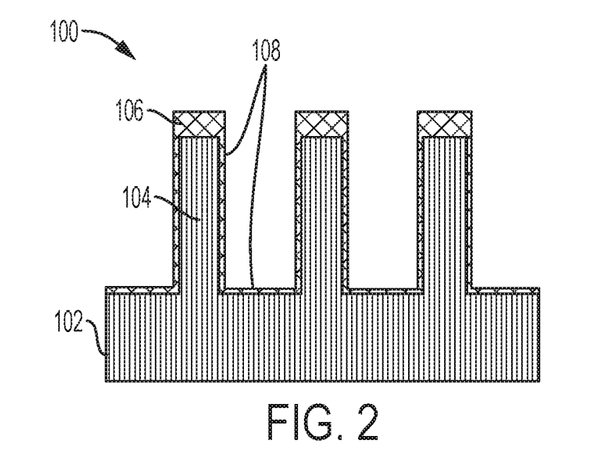
FIG. 2 depicts a cross-sectional view of the structure displaying a conformal liner deposited on the fins according to one or more embodiments of the present invention.

FIG. 2 depicts a cross-sectional view of the structure 100 including a conformal liner deposited on the sidewalls of the fins according to one or more embodiments of the present invention. FIG. 2 is a continuation of the processes discussed in FIG. 1. A conformal liner 108 (liner) is deposited onto the vertical sides (sidewalls) of the fins 104 and substrate 102 and makes contact with the mask 106. The liner 108 can be, but is not required, to be formed from the same material as mask 106. In some embodiments, liner 108 is formed from SiN.

Figure 3:
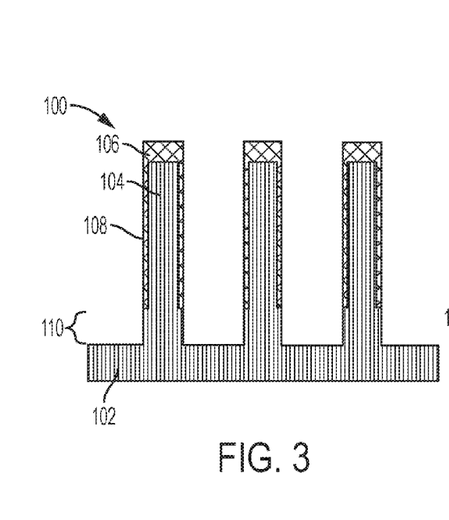
FIG. 3 depicts a cross-sectional view of the structure after an etching process removes the bottom portion of the liner and portions of the base of the fins according to one or more embodiments of the present invention.

FIG. 3 depicts a cross-sectional view of the structure 100 after an etching process removes the bottom portion of the liner and portions of the base of the fins according to one or more embodiments of the present invention. FIG. 3 is a continuation of the processes discussed in FIG. 2. The structure 100 displays portions of the liner 108 that is removed by the etching process, and exposes an area 110 of the lower fin sidewalls 110 of the fins 104 for further processing. The lower fin sidewalls 110 thus are not protected from an etching process as described in FIG. 4.

Figure 4:
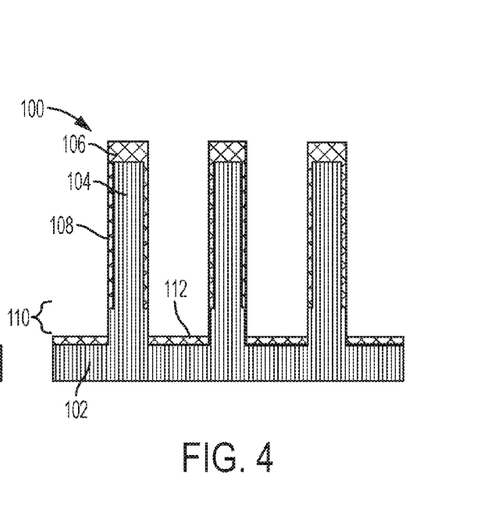
FIG. 4 depicts a cross-sectional view of the structure after deposition of a liner onto the substrate according to one or more embodiments of the present invention.

FIG. 4 depicts a cross-sectional view of the structure 100 after deposition of a liner onto the substrate according to one or more embodiments of the present invention. FIG. 4 is a continuation of the processes discussed in FIG. 3. A substrate liner 112 is conformally deposited over the horizontal surfaces of the substrate 102. The substrate liner 112 can, but is not required to be, formed from the same material as mask 106. In some embodiments, substrate liner 112 is formed from SiN. Note that the lower fin sidewalls 110 are left unlined and are not protected by the substrate liner 112.

Figure 5:
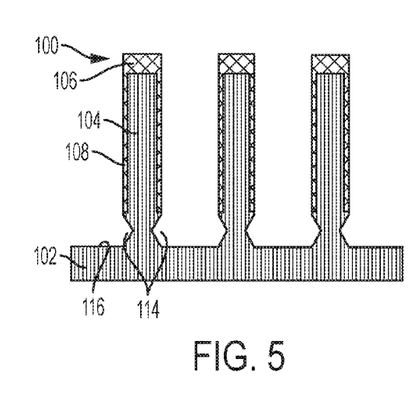
FIG. 5 depicts a cross-sectional view of the structure after etching recesses into the fins and removal of the liner from the substrate according to one or more embodiments of the present invention.

FIG. 5 depicts a cross-sectional view of the structure 100 after etching recesses into the fins and removal of the liner from the substrate according to one or more embodiments of the present invention. FIG. 5 is a continuation of the processes discussed in FIG. 4. Bottom lateral recesses 114 are etched into the base of the fins 104. Two methods to remove material from the lower fin sidewalls 110 include gas phase hydrofluoric acid (HCl) and a wet etch process with an etchant containing ammonia and hydrogen peroxide, but other embodiments of the present invention can apply different etching processes and are not limited herein. The bottom recesses 114 project inwards through the base of the fins 104 and reduce the width of the fins 104. The bottom recesses 114 create spaces at the base of the fins 104 to allow for the deposition of additional materials to be discussed in the following figures. An etching process is conducted to remove the substrate liner 112 (of FIG. 4) and exposes the substrate horizontal surface 116. The substrate horizontal surface 116, without a liner, can now accept further deposition of materials. The etching process can include, but is not limited to, a directional anisotropic reactive-ion etching (RIE) process. Embodiments of the present invention are not limited as to the specific process applied for etching the structure, and other processes are possible.

Figure 6:
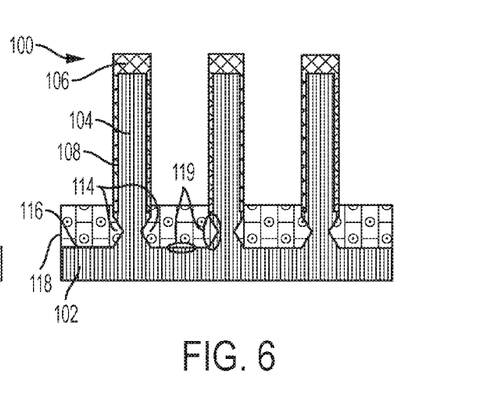
FIG. 6 depicts a cross-sectional view of the structure after growing a S/D bottom region onto the substrate and fins according to one or more embodiments of the present invention.

FIG. 6 depicts a cross-sectional view of the structure 100 after growing an S/D bottom region onto the substrate and fins according to one or more embodiments of the present invention. FIG. 6 is a continuation of the processes discussed in FIG. 5. In one or more embodiments, an epitaxial growth process is performed to fill the bottom recesses 114 to form a bottom S/D region 118. In some embodiments, the bottom S/D region 118 can be made of silicon germanium (SiGe). The bottom S/D region 118 encompasses a space that includes the bases of two adjoining fins 104, filling the bottom recesses 114 of the fins 104. The bottom S/D region 118 is also in contact with the substrate horizontal surface 116. The bottom S/D region 118 forms a plurality of first PN junctions 119 with both the fins 104 and the substrate 102. In one or more embodiments, dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. The bottom S/D region 118 can be silicon, silicon germanium, germanium, carbon doped silicon, carbon doped silicon germanium, or any other suitable semiconductor material. In one or more embodiments, an annealing process can be conducted at this time to the bottom S/D regions 118 in order to push the first PN junctions 119 further into the fins 104. A thermal anneal process such as laser anneal, flash anneal, rapid thermal anneal (RTA), furnace anneal, or any suitable combination of those annealing techniques can be performed.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (SiC) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 7:
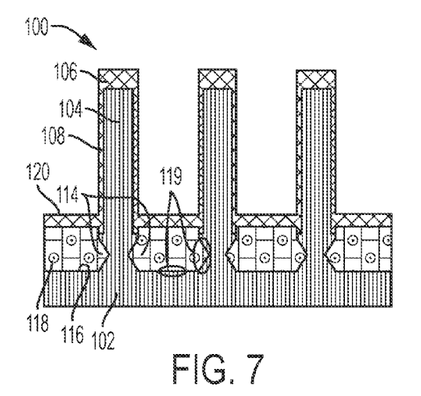
FIG. 7 depicts a cross-sectional view of the structure after depositing a bottom spacer according to one or more embodiments of the present invention.

FIG. 7 depicts a cross-sectional view of the structure 100 after depositing a bottom spacer according to one or more embodiments of the present invention. FIG. 7 is a continuation of the processes discussed in FIG. 6. A bottom spacer 120 is deposited on top of the bottom S/D region 118 and extends outwards to establish contact with the liner 108 of the fins 104. The bottom spacer 120 can include a single or multiple dielectric materials, including but not limited to, silicon oxide, silicon oxynitride, silicon nitride, SiBCN, SiOCN, SiOC, and SiCN.

Figure 8:
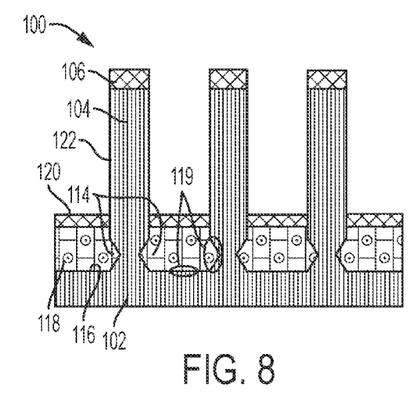
FIG. 8 depicts a cross-sectional view of the structure after etching the liner from the sidewalls of the fins according to one or more embodiments of the present invention.

FIG. 8 depicts a cross-sectional view of the structure 100 after etching the liner from the sidewalls of the fins according to one or more embodiments of the present invention. FIG. 8 is a continuation of the processes discussed in FIG. 7. The liner 108 (of FIG. 7) is removed by an etching process as described in FIG. 5. In some embodiments, an additional method to remove the liner 108 (of FIG. 7) includes a conformal dry etch process. After the etching process is completed, the sidewalls 122 of the fins 104 are left exposed.

Figure 9:
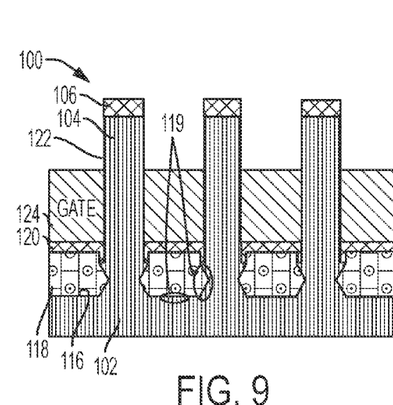
FIG. 9 depicts a cross-sectional view of the structure after depositing a gate layer onto the structure according to one or more embodiments of the present invention.

FIG. 9 depicts a cross-sectional view of the structure 100 after depositing a gate layer onto the structure according to one or more embodiments of the present invention. FIG. 9 is a continuation of the processes discussed in FIG. 8. The method continues with the deposition of a high-k gate layer 124 (gate) on top of the bottom spacer 120. In one or more embodiments, the gate 124 includes a high-k gate dielectric and a gate conductor. The gate dielectric can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate 124 material can further include dopants such as lanthanum and aluminum. The gate conductor material can include doped polycrystalline or amorphous silicon, germanium, silicon germanium, a metal (e.g., tungsten, titanium, tantalum, ruthenium, zirconium, cobalt, copper, aluminum, lead, platinum, tin, silver, or gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, or nickel silicide), carbon nanotube, conductive carbon, graphene, or any suitable combination of these materials. The conductive material can further include dopants that are incorporated during or after deposition. The gate 124 can further include a work function setting layer. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 10:
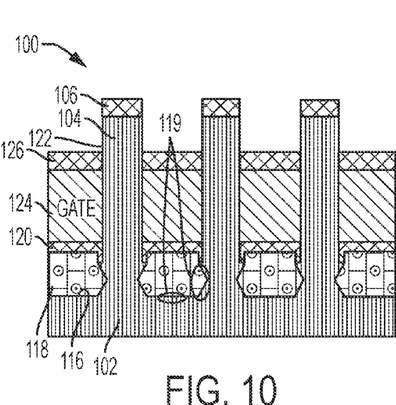
FIG. 10 depicts a cross-sectional view of the structure after depositing a top spacer onto the substrate according to one or more embodiments of the present invention.

FIG. 10 depicts a cross-sectional view of the structure 100 after depositing a top spacer onto the substrate according to one or more embodiments of the present invention. FIG. 10 is a continuation of the processes discussed in FIG. 9. A top spacer 126 is deposited on top of the gate 124 and extends outwards to establish contact with the sidewalls 122 of the fins 104. The top spacer 126 can include a single dielectric material or multiple dielectric materials, including but not limited to, silicon oxide, silicon oxynitride, silicon nitride, SiBCN, SiOCN, SiOC, and SiCN. Additionally, in one or more embodiments, the top spacer 126 can include the same or different materials used to form the bottom spacer 120.

Figure 11:
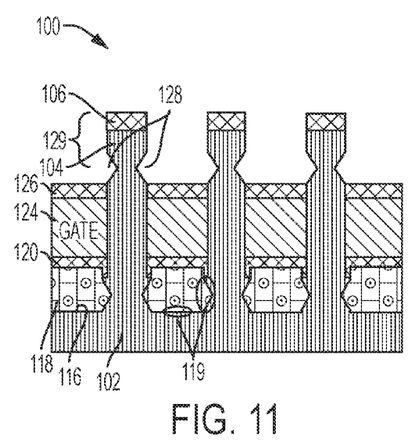
FIG. 11 depicts a cross-sectional view of the structure after etching recesses into the fins according to one or more embodiments of the present invention.

FIG. 11 depicts a cross-sectional view of the structure 100 after etching recesses into the fins according to one or more embodiments of the present invention. FIG. 11 is a continuation of the processes discussed in FIG. 10. Top lateral recesses 128 are etched into the upper sidewalls 129 of the fins 104. Two methods to remove material from the upper sidewalls 129 include gas phase hydrofluoric acid (HCl) and a wet etch process with an etchant containing ammonia and hydrogen peroxide, but other embodiments of the present invention can apply different etching processes and are not limited herein. The top recesses 128 project inward through the upper areas of the fins 104 and reduce the width of the fins 104. The top recesses 128 create spaces for the deposition of additional materials as discussed in the following figures. The etching process can include, but is not limited to, a directional anisotropic reactive-ion etching (RIE) process. Embodiments of the present invention are not limited as to the specific process applied for etching the structure, and other processes are possible.

Figure 12:
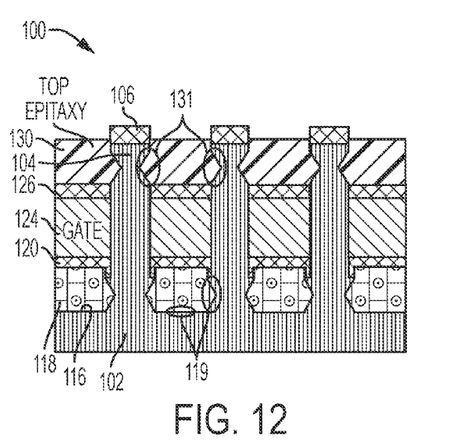
FIG. 12 depicts a cross-sectional view of the structure after growing a top S/D region onto the structure according to one or more embodiments of the present invention.

FIG. 12 depicts a cross-sectional view of the structure 100 after growing a top S/D region onto the upper spacer and fins according to one or more embodiments of the present invention. FIG. 12 is a continuation of the processes discussed in FIG. 11. This process is similar to the process as described in FIG. 6 to grow the bottom S/D region. In one or more embodiments, an epitaxial growth process is performed to fill the top recesses 128 to form a top S/D region 130. The top S/D region 130 can be made of silicon germanium (SiGe). The top S/D region 130 encompasses a space that includes the upper areas of two adjoining fins 104 and filling the top recesses 128. The top S/D region 130 forms a plurality of second PN junctions 131 with the fins 104. In one or more embodiments, dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. The top S/D region 130 can be silicon, silicon germanium, germanium, carbon doped silicon, carbon doped silicon germanium, or any other suitable semiconductor material. In one or more embodiments, an annealing process can be conducted to the top S/D region 130 in order to push the second PN junctions 131 further into the fins 104. A thermal anneal process such as laser anneal, flash anneal, rapid thermal anneal (RTA), furnace anneal, or any suitable combination of those annealing techniques can be performed.

Figure 13:
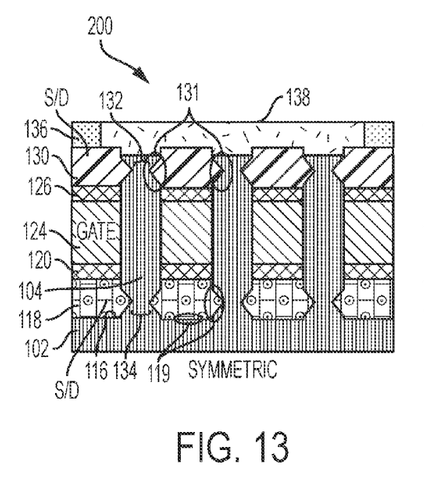
FIG. 13 depicts a cross-sectional view of the structure with symmetric top/bottom S/D regions according to one or more embodiments of the present invention.

FIG. 13 depicts a cross-sectional view of the structure 200 with symmetric top/bottom S/D regions according to one or more embodiments of the present invention. FIG. 13 is a continuation of the processes discussed in FIG. 12. This step includes a selective etch to remove the mask 106 that was deposited as described in FIG. 1. An inter-layer dielectric layer 136 (ILD) is deposited onto the structure 200. The ILD layer 136 can include a single or multiple dielectric materials, including but not limited to, silicon oxide, silicon oxynitride, silicon nitride, SiBCN, SiOCN, SiOC, and SiCN. The method continues with a contact pattern applied to the structure 200 and a metal contact layer 138 deposited over the fins 104 and top S/D regions 130. The metal contact 138 can be made of tungsten (atomic symbol W). Non-limiting methods for forming contacts include depositing a dielectric material, patterning to form contact trenches, and filling the trenches with a conducting material. The resulting structure 200, as seen in FIG. 13, displays a symmetric vertical FET structure with identical bottom and top S/D regions creating symmetric top gaps 132 and bottom gaps 134 within the fin 104.

Figure 14:
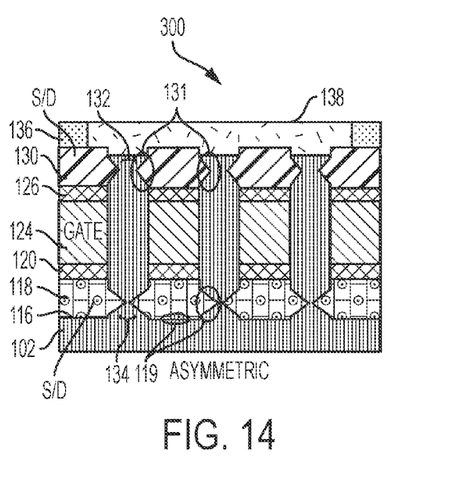
FIG. 14 depicts a cross-sectional view of the structure with asymmetric top/bottom S/D regions according to one or more embodiments of the present invention.

FIG. 14 depicts a cross-sectional view of the structure 300 with asymmetric top/bottom S/D regions according to one or more embodiments of the present invention. FIG. 14 is a continuation of the processes discussed in FIG. 12. As described in FIG. 13, a selective etch is applied, an ILD layer 136 is deposited, and the metal contact 138 is deposited over the fins 104 and top S/D regions 130. The resultant structure 300 is identical to the structure 200 discussed in FIG. 13, with the exception of having asymmetric top gaps 132 and bottom gaps 134 within the fin 104.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiment of the present invention have been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for describing particular embodiments only and is not intended to be limiting of embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While embodiments of the present invention have been described in detail in connection with only a limited number of embodiments, it should be readily understood that embodiments of the present invention are not limited to such described embodiments. Rather, embodiments of the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method for forming features of a vertical field-effect transistor (FET), the method comprising:
    forming a semiconductor substrate that includes a fin structure, wherein the substrate includes a horizontal surface, and wherein the fin structure including a base, a top, and sidewalls;
    etching the fin structure sidewalls to form bottom lateral recesses at the base of the fin structure;
    growing a bottom source/drain region in the bottom lateral recesses of the fin structure, therefore forming PN junctions with the fin structure;
    etching the fin structure sidewalls to form top lateral recesses at the top of the fin structure; and
    growing a top source/drain region in the top lateral recesses of the fin structure, therefore forming PN junctions with the fin structure.

2. The method of claim 1 further comprising depositing a mask on the top and sidewalls of the fin structure and on the horizontal surface of the substrate, and etching away the mask on a lower portion of the sidewalls of the fin structure.

3. The method of claim 1 further comprising depositing a bottom spacer, a high-k gate structure, and a top spacer over the bottom source/drain region.

4. The method of claim 1, wherein the bottom and top source/drain regions are identical in shape, forming symmetric bottom and top source/drain regions.

5. The method of claim 1, wherein the bottom and top source/drain regions are different in shape, forming asymmetric bottom and top source/drain regions.

6. The method of claim 1 further comprising an annealing step to push the bottom source/drain region further into the fin, therefore extending the PN junctions.

7. The method of claim 1 further comprising an annealing step to push the top source/drain region further into the fin, therefore extending the PN junctions.

8. The method of claim 1, wherein the bottom source/drain region is doped.

9. The method of claim 1, wherein the top source/drain region is doped.

10. The method of claim 1, wherein the bottom and top source/drain regions are comprised of silicon germanium (SiGe).

11. A semiconductor field-effect transistor (FET) device comprising:
   a semiconductor substrate that includes a vertical fin structure;
   a bottom lateral recess in the fin structure, the bottom lateral recess containing a bottom source/drain region, therefore forming PN junctions with the fin structure; and
   a top lateral recess in the fin structure, the top lateral recess containing a top source/drain region, therefore forming PN junctions with the fin structure.

12. The device of claim 11, wherein the bottom and top source/drain regions are identical in shape, forming symmetric bottom and top source/drain regions.

13. The device of claim 11, wherein the bottom and top source/drain regions are different in shape, forming asymmetric bottom and top source/drain regions.

14. The device of claim 11 further comprising a bottom spacer, a high-k gate structure, and a top spacer over the bottom source/drain region.

15. The device of claim 11 further comprising a metal contact layer over the fin structure and top source/drain region.

16. The device of claim 11, wherein the source/drain regions are annealed to extend the PN junctions by bringing dopants closer to the surface of the recesses.

17. The device of claim 11, wherein the device can be tuned by changing the shape of the bottom source/drain regions.

18. The device of claim 11, wherein the device can be tuned by changing the shape of the top source/drain regions.

19. The device of claim 11, wherein the bottom source/drain region is doped.

20. The device of claim 11, wherein the top source/drain region is doped.

* * * * *